(12) United States Patent
Lima

(10) Patent No.: US 6,256,196 B1
(45) Date of Patent: Jul. 3, 2001

(54) DESIGN FOR CIRCUIT BOARD ORTHOGONAL INSTALLATION AND REMOVAL

(75) Inventor: David J. Lima, Los Altos, CA (US)

(73) Assignee: Silicon Graphics, Inc., Mountain View, CA (US)

(*) Notice: Subject to any disclaimer, the term of this patent is extended or adjusted under 35 U.S.C. 154(b) by 0 days.

(21) Appl. No.: 09/346,659

(22) Filed: Jul. 1, 1999

(51) Int. Cl.[7] ........................................ G06F 1/16
(52) U.S. Cl. .................. 361/687; 361/737; 361/697; 165/122; 174/16.3
(58) Field of Search ...................... 361/687, 737, 361/741, 756, 700, 697; 439/159, 905; 165/80.4, 104.33, 122–126; 62/259.2; 174/15.2, 16.3

(56) References Cited

U.S. PATENT DOCUMENTS

| 5,330,360 | * | 7/1994 | Marsh et al. | 439/76 |
| 5,864,463 | * | 6/1999 | Tsukada et al. | 361/686 |
| 5,951,665 | * | 9/1999 | Crane, Jr. et al. | 710/126 |
| 6,118,667 | * | 9/2000 | Grosser et al. | 361/752 |

\* cited by examiner

Primary Examiner—Leo P. Picard
Assistant Examiner—Hung Van Duong
(74) Attorney, Agent, or Firm—Wagner, Murabito & Hao LLP

(57) ABSTRACT

A system and method thereof for inserting a circuit board into and removing it from a computer system. The system includes a casing sized and shaped to enclose the circuit board. The casing has an opening for accessing an internal connector interface of the circuit board. The computer system is adapted to allow insertion and removal of the casing containing the circuit board. In one embodiment, the computer system includes an enclosure with an external opening. The casing containing the circuit board is inserted into the enclosure through the external opening so that the connector interface couples with a receptor in the computer system. Thus, the circuit board can be readily installed and removed without, for example, having to power off and open up the computer system.

37 Claims, 9 Drawing Sheets

210

260

DESIGN FOR CIRCUIT BOARD ORTHOGONAL INSTALLATION AND REMOVAL

TECHNICAL FIELD

The present invention pertains to the field of computer system hardware design. In particular, the present invention pertains to a system and method thereof facilitates modifying a computer system (e.g., inserting or removing a circuit board).

BACKGROUND ART

A typical computer system has a housing that surrounds its internal components including the printed circuit boards used to configure optional features of the computer system. The configurable circuit boards are coupled to the computer system's chassis or motherboard through an internal connector interface. The circuit board also may have an external connector interface through the housing so that it can be connected to a peripheral component or various other devices.

The housing provides an enclosure that helps protect the internal components of the computer system and also shields the surrounding environment from the electromagnetic radiation (EMI) generated by the computer system. Openings in the housing, such as that for the external connector interface of a circuit board, are typically sealed to prevent or limit EMI leakage from the computer system.

Thus, a disadvantage to the prior art is that in order to modify or upgrade a computer system—for example, to install a new circuit board—it must be shut off, the housing opened, the circuit board inserted into place and the proper connections made, and the housing reassembled and closed.

It is commonplace for multiple computer systems to be situated in a single location. For example, for economic or space efficiency reasons, multiple computer systems are typically located in a single air-conditioned room. This also facilitates connecting the computer systems to each other by cables. To optimize use of the available floor space, the computer systems are tightly quartered and are often placed one on top of another in racks.

The above disadvantage in the prior art is compounded when a modification to one or more of these computer systems is needed. For example, when the computer system is installed in a rack, it must be turned off, uncabled from the other computer systems, removed from the rack and placed somewhere else in order to perform the necessary work, the housing opened, the circuit board inserted into place and the proper connections made, the housing reassembled and closed, the computer system reinstalled in the rack and recabled to the other computer systems, and then turned back on. This series of operations is burdensome and time consuming, and is further aggravated by the close quarters in which they are performed. In addition, it is desirable to keep the computer system powered on while it is being worked on, in order to minimize the disruption to users and to perturb the other computer systems as little as possible.

Some prior art techniques attempt to address the problems described above by making the housing easier to open and close and by allowing the circuit board to be removed and installed without having to shut down the computer. However, these techniques only address a portion of the overall problem; it is still necessary to uncable the computer, remove it from the rack, find a place to work on it, reinstall it in the rack, and recable it to the other computer systems.

In addition, in those instances in which the computer is not shut down and the housing is open, there is a significant breach of the EMI insulation and therefore substantial EMI leakage.

Other prior art techniques attempt to address the problems described above by equipping the rack with sliding arms that hold the computer systems. In this approach, when work is to performed on a computer system, it can be slid from the rack and supported by the sliding arms. However, it is still often necessary to uncable the computer system in order to allow it to be moved. In addition, some racks are more than eight feet tall, making it difficult to work in place on the computer system. In any event, it is still necessary to open and close the housing to install the new circuit board, which requires that the computer system be shut off or otherwise allows substantial EMI leakage. Hence, these prior art techniques also do not provide a solution to the overall problem.

Accordingly, what is needed is a technique that facilitates modifying or upgrading the internal components of a computer system. What is also needed is a technique that addresses the above need and is suited for use in a close quarters environment, in particular one in which multiple computers are present and situated, for example, in a rack. What is further needed is a technique that addresses the above needs and also minimizes the disruption to users and other computer systems, by allowing work to be performed while the computer system is powered on and cabled to other computer systems and minimizing, for example, EMI leakage. The present invention provides a novel solution to the above needs.

These and other objects and advantages of the present invention will become obvious to those of ordinary skill in the art after having read the following detailed description of the preferred embodiments which are illustrated in the various drawing figures.

DISCLOSURE OF THE INVENTION

The present invention provides a system and method thereof that facilitate modifying or upgrading the internal components of a computer system. The present invention also provides a system and method thereof that address the above need and are suited for use in a close quarters environment, in particular one in which multiple computers are present and situated, for example, in a rack. The present invention also provides a system and method thereof that address the above needs and also minimize the disruption to users and other computer systems, by allowing work to be performed while the computer system is powered on and cabled to other computer systems and minimizing, for example, electromagnetic radiation (EMI) leakage.

The present invention pertains to a system and method thereof for inserting a circuit board into or removing a circuit board from a computer system. The system includes a casing sized and shaped to enclose the circuit board. The casing has an opening for accessing an internal connector interface of the circuit board, and can also have another opening for accessing an external connector interface of the circuit board.

The computer system is adapted to allow insertion and removal of the casing containing the circuit board. In one embodiment, the computer system includes an enclosure with an external opening. The casing containing the circuit board is inserted into the enclosure through the external opening so that the internal connector interface couples with a receptor in the computer system. In one embodiment, the enclosure is of sufficient size and shape to hold multiple casings.

In one embodiment, the casing is comprised of a first member and a second member, which are separated so that the circuit board can be inserted into the casing.

In one embodiment, a latching device is coupled to the casing. The latching device serves to secure the casing within the computer system and to facilitate coupling of the circuit board's internal connector interface with the computer system receptor. One implementation of the latching device includes a lever coupled to a cam; movement of the lever causes the cam to rotate and engage with a slot in the computer system.

In one embodiment, the latching device triggers a switch that causes the computer system to electrically integrate the circuit board (and to isolate the circuit board prior to removing it from the computer system).

In one embodiment, the casing includes an inlet port for cooling the circuit board and one or more exhaust ports for conveying heat out of the casing and away from the circuit board. The inlet port engages with the cooling system used by the computer system when the casing is inserted into the computer system.

In one embodiment, the casing includes one or more tabs projecting from its inner surface to support the circuit board within the casing.

In accordance with the present invention, a circuit board contained within the casing can be plugged into or unplugged from a computer system without having to open up or power off the computer system. The casing allows for cooling and provides an enclosure to help control EMI emitted by the circuit board, and also protects the circuit board during handling.

BRIEF DESCRIPTION OF THE DRAWINGS

The accompanying drawings, which are incorporated in and form a part of this specification, illustrate embodiments of the invention and, together with the description, serve to explain the principles of the invention.

BEST MODE FOR CARRYING OUT THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

The present invention pertains to a system and method thereof for inserting a circuit board into or removing a circuit board from a computer system. The system includes a casing sized and shaped to enclose the circuit board. The computer system is adapted to allow the casing containing the circuit board to be readily inserted or removed through an external opening in the computer system's housing.

Figure 1:
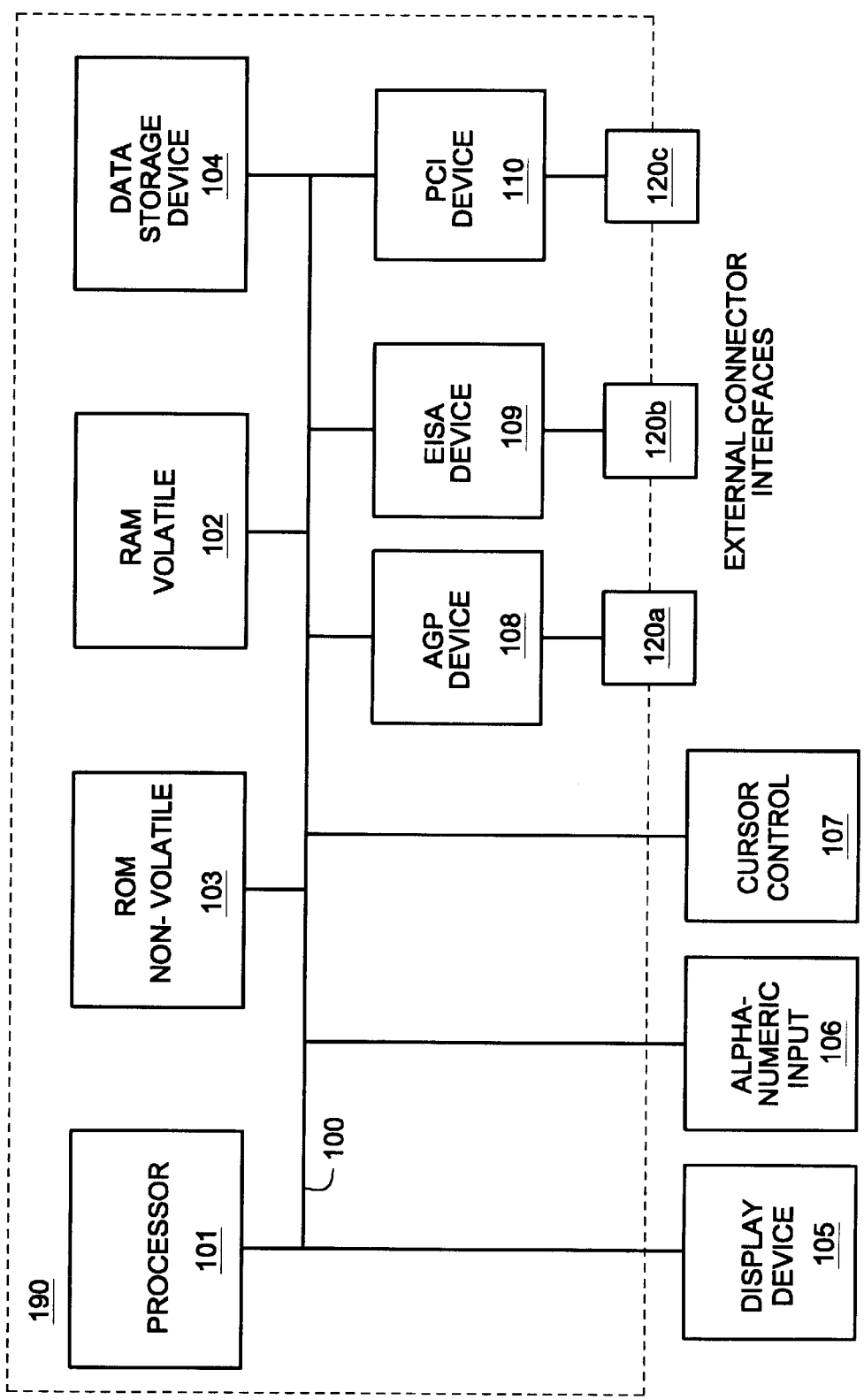
FIG. 1 illustrates a general purpose computer system in accordance with one embodiment of the present invention.

Refer to FIG. 1 which illustrates a general purpose computer system 190 in accordance with one embodiment of the present invention. Computer system 190 may be one of a plurality of computer systems coupled to each other, for example, by cables or in a network.

In general, computer system 190 comprises a bus 100 for communicating information, a central processor 101 coupled with bus 100 for processing information and instructions, a random access memory 102 coupled with bus 100 for storing information and instructions for central processor 101, a read-only memory 103 coupled with bus 100 for storing static information and instructions for central processor 101, a data storage device 104 such as a magnetic or optical disk and disk drive coupled with bus 100 for storing information and instructions, a display device 105 coupled to bus 100 for displaying information to the computer user, an optional alphanumeric input device 106 including alphanumeric and function keys coupled to bus 100 for communicating information and command selections to central processor 101, and an optional cursor control device 107 coupled to bus 100 for communicating user input information and command selections to central processor 101.

Display device 105 utilized with computer system 190 of the present invention may be a liquid crystal device, cathode ray tube, or other display device suitable for creating graphic images and alphanumeric characters recognizable to the user. Cursor control device 107 allows the computer user to dynamically signal the two-dimensional movement of a visible symbol (pointer) on a display screen of display device 105. Many implementations of the cursor control device are known in the art including a trackball, mouse, joystick or special keys on alphanumeric input device 106 capable of signaling movement of a given direction or manner of displacement. It is to be appreciated that the cursor control device 107 also may be directed and/or activated via input from the keyboard using special keys and key sequence commands. Alternatively, the cursor may be directed and/or activated via input from a number of specially adapted cursor directing devices.

Continuing with reference to FIG. 1, also coupled to bus 100 are a plurality of printed circuit boards known in the art and exemplified by AGP (Accelerated Graphics Port) device 108, EISA (Extended Industry Standard Architecture) device 109, and PCI (Peripheral Component Interconnect) device 110. It is appreciated that various other devices known in the art may be used in accordance with the present invention, such as an ISA (Industry Standard Architecture) device, a video adapter, and other like devices. It is further appreciated that each of these devices can have an external connector interface (e.g., external connector interfaces 120a–c), such as a plug or a set of pins, so that the device can be externally coupled to another device.

Figure 2A:
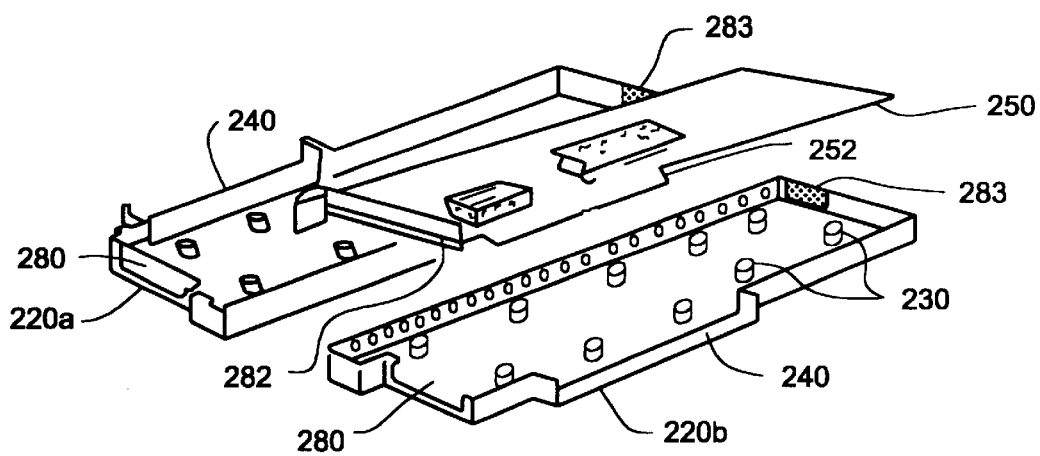
FIGS. 2A and 2B are illustrations of a casing used to enclose a circuit board in accordance with one embodiment of the present invention.

FIG. 2A is an illustration of a casing 210 used to enclose a circuit board 250 in accordance with one embodiment of the present invention. In this embodiment, casing 210 is comprised of first member 220a and second member 220b. First member 220a and second member 220b are separated so that circuit board 250 can be placed inside casing 210. Once circuit board 250 is placed inside, casing 210 provides protective packaging for the circuit board during subsequent handling. Circuit board 250 is a printed circuit board such as an AGP device, an EISA device, an ISA device, a PCI device, or another type of device such as a video adapter.

When assembled, casing 210 has an internal opening 240 which allows access to an internal connector interface (e.g., one or more plugs or pins, not shown) of circuit board 250. In one embodiment, casing 210 also has an external opening 280 which allows access to an external connector interface (e.g., one or more plugs or pins, not shown) of circuit board 250 (for circuit boards with an external connector interface). Casing 210 also has (when assembled) an opening 283 for venting air into the casing. It is appreciated that in other embodiments, a different construction can be used to enclose circuit board 250 in accordance with the present invention. For example, casing 210 can be substantially comprised of a single piece that encloses circuit board 250, with a flap or sliding door that is removable or can be opened to allow the circuit board to be inserted or removed. In one embodiment, casing 210 is made of brushed stainless steel, although it is appreciated that other materials can be used.

In the present embodiment, projecting from the inner surfaces of casing 210 are one or more tabs 230 that are used to facilitate positioning of circuit board 250 inside casing 210, and to hold circuit board 250 in place once it is positioned. In one embodiment, tabs 230 are made of plastic and therefore serve to insulate circuit board 250 from casing 210. Alternatively, tabs 230 can be made of elastic material to comply with different thicknesses of circuit board 250. Tabs 230 can also be of electrically conductive material in order to couple circuits in circuit board 250 to the metallic casing (e.g., casing 210) if needed for some purpose such as EMI or ESD (electrostatic discharge) protection. It is appreciated that, depending on the function(s) desired, tabs 230 can be made of various materials and in various shapes.

In one embodiment, tabs 230 are removable and can be repositioned inside casing 210 in order to accommodate different configurations of circuit boards inside a standardized general purpose casing design. For example, tabs 230 can be moved so that they do not interfere with a component protruding from the surface of circuit board 250. In this manner, the width of casing 210 can be standardized at an nominal value that allows a computer system to accommodate a maximum number of circuit boards in accordance with the present invention. However, it is understood that casings of varying widths can be used in accordance with the present invention.

Figure 2B:
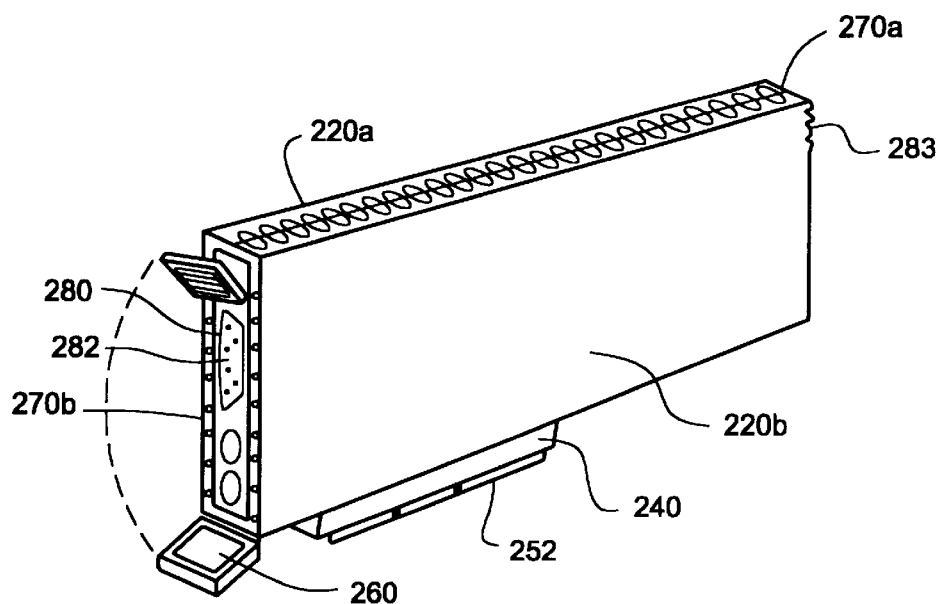

FIG. 2B illustrates an assembled version of casing 210 in accordance with one embodiment of the present invention. Protruding from internal opening 240 is the internal connector interface 252 of circuit board 250 (FIG. 2A). In addition, external connector interface 282 of circuit board 250 is accessible through external opening 280. Thus, when enclosed in casing 210 and inserted into a computer system, circuit board 250 can be coupled to the computer system via internal connector interface 252, and to a peripheral component or device via external connector interface 282.

With reference still to FIG. 2B, in the present embodiment of the present invention, casing 210 includes latching device 260. Movement of latching device 260 causes internal connector interface 252 to engage a receptor (e.g., one or more plugs or pins, not shown) in a computer system. Latching device 260 also functions to secure casing 210 in the computer system. Additional information is provided in conjunction with FIG. 7 below. In one embodiment, a label identifying the particular circuit board enclosed by casing 210 can be affixed to latching device 260.

In the present embodiment, casing 210 also includes one or more openings or vents (e.g., ports 270a and 270b) allowing ventilation of circuit board 250. When inserted into a computer system, the casing is engaged with the computer system's cooling system. Air, for example, is vented into casing 210 from the cooling system via opening 283, which is formed in the casing when the two sides (first member 210a and second member 210b) are assembled,. The air is exhausted through ports 270a and 270b, thereby conveying heat away from circuit board 250. Casing 210 can enhance circuit board cooling because air flow is forced across circuit board 250 and through ports 270a and 270b by the computer system's cooling system. Additional information is provided in conjunction with FIG. 3.

Thus, casing 210 provides an enclosure that serves as shielding for containing electromagnetic radiation (EMI), allows cooling of the circuit board, and provides a package that protects the circuit board as it is being installed into or removed from a computer system.

Figure 3:
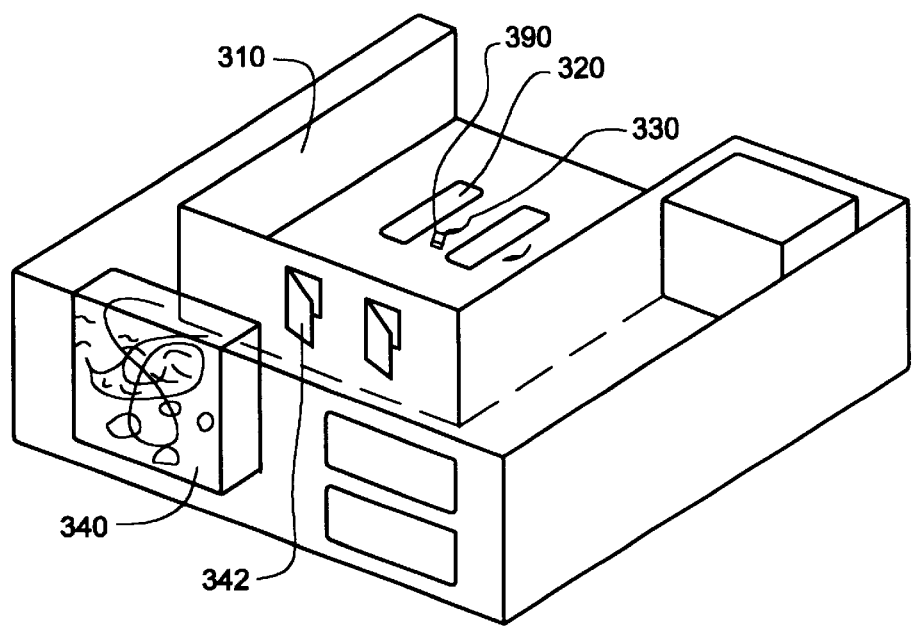
FIG. 3 illustrates a computer system housing adapted to allow the casing of FIGS. 2A and 2B to be inserted or removed in accordance with one embodiment of the present invention.

FIG. 3 illustrates a computer system housing 300 adapted to allow casing 210 (FIGS. 2A and 2B) to be inserted or removed in accordance with one embodiment of the present invention. Housing 300 is shown without its upper surface (e.g., lid) in FIG. 3 and in subsequent figures in order to clearly illustrate the system of the present invention. Housing 300 includes a bay (e.g., enclosure 310) into which one or more circuit boards, each enclosed in a casing 210, are placed. Enclosure 310 in combination with casing 210 provides shielding for minimizing EMI leakage. If a location is not occupied by a casing, then enclosure 310 provides the requisite EMI shielding.

In the present embodiment, enclosure 310 includes a plurality of receptors 320 (e.g., plugs or pins) that couple with internal connector interface 252 (FIG. 2B) in order to couple circuit board 250 (FIG. 2A) with the other elements of the computer system (refer to FIG. 1). Enclosure 310 also includes a plurality of slots 330 for engaging with latching device 260 (FIG. 2B). Enclosure 310 also contains switch 390 that is triggered by latching device 260 (FIG. 2B) when casing 210 is in place. Switch 390 causes computer system 190 to electrically integrate circuit board 250 or to isolate the circuit board prior to its removal; refer also to FIG. 7 below. It is appreciated that switch 390 can be placed in a different location and can be otherwise triggered by casing 210 in accordance with the present invention.

Continuing with reference to FIG. 3, cooling system 340 is a wellknown mechanism for circulating cooling air around the various components in a computer system. Typically, cooling system 340 uses a fan to force air from outside of housing 300 through the computer system, although it is appreciated that other cooling mechanisms may be used in accordance with the present invention. In the present embodiment, enclosure 310 includes a plurality of dampers 342 for permitting air to flow into enclosure 310. Each damper 342 is positioned so that it can engage with a corresponding casing 210 (FIGS. 2A and 2B) that is inserted into enclosure 310.

In accordance with the present embodiment of the present invention, damper 342 is in a closed position unless casing 210 is inserted. When installed, casing 210 causes damper 342 to open, thereby permitting the flow of air from cooling system 340 through casing 210 in order to cool circuit board 250. As discussed in conjunction with FIG. 2B above, air is forced through casing 210 by cooling system 340 via damper 342 through opening 283, and exhausted via ports 270a and 270b. Hence, in accordance with the present invention, circuit board cooling can be enhanced relative to previous methods for cooling.

Figure 4:
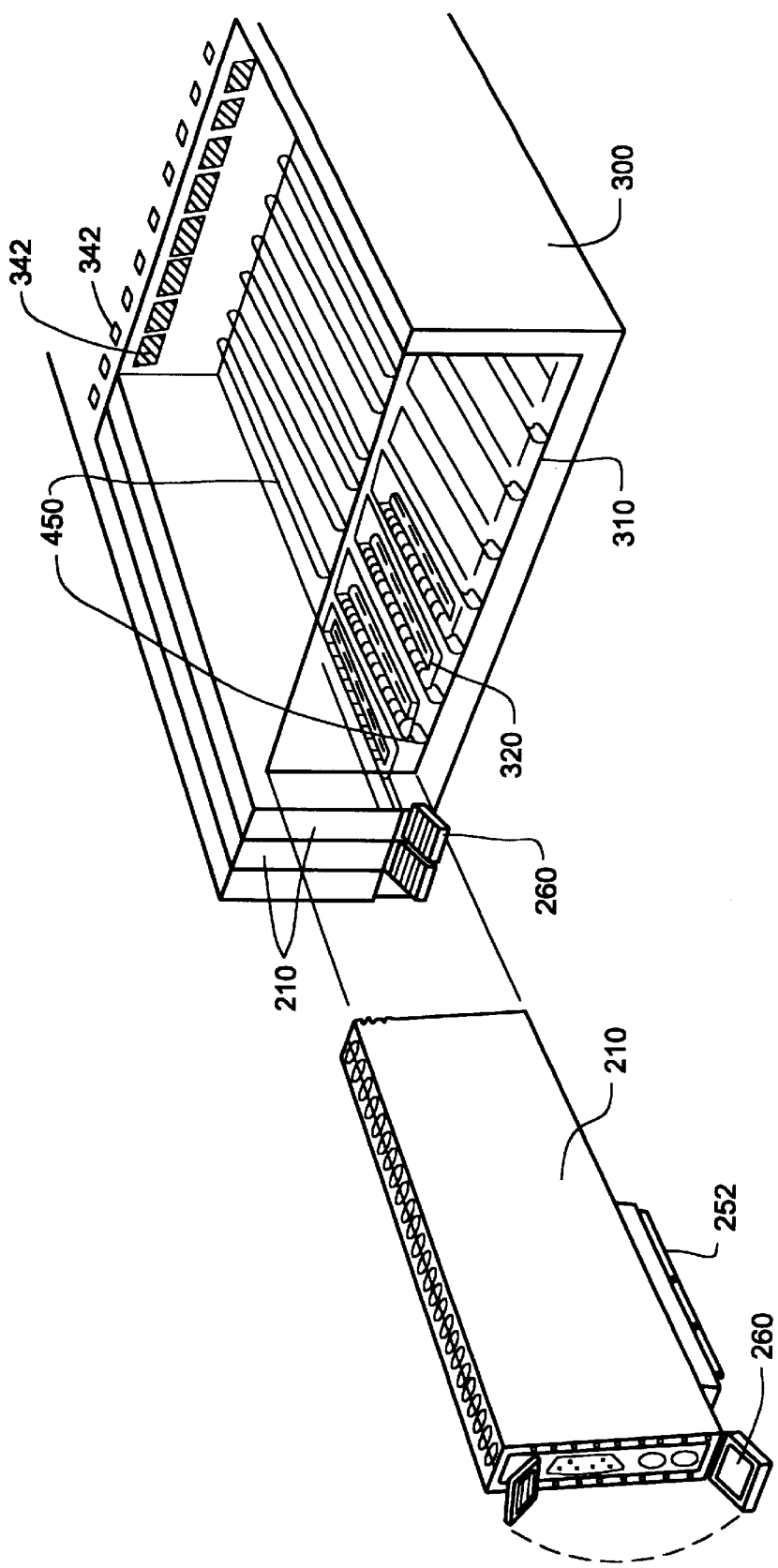
FIG. 4 is an illustration showing the casing of FIGS. 2A and 2B in use with a computer system adapted to allow the casing to be installed or removed in accordance with one embodiment of the present invention.

FIG. 4 is an illustration showing casing 210 in use with a computer system adapted to allow the casing to be installed or removed in accordance with one embodiment of the present invention. One or more casings can be placed into enclosure 310 in housing 300 and secured in place using latching device 260. A damper 342 corresponds to each possible casing location, and is opened when a casing 210 is inserted and closed when a casing 210 is removed. In the present embodiment, the action of securing casing 210 in place helps to ensure that casing 210 is properly positioned and also causes internal interface connector 252 to couple with receptor 320. In one embodiment, enclosure 310 also includes guides 450 that help position casing 210 and thus facilitate its insertion and removal.

Figure 5:
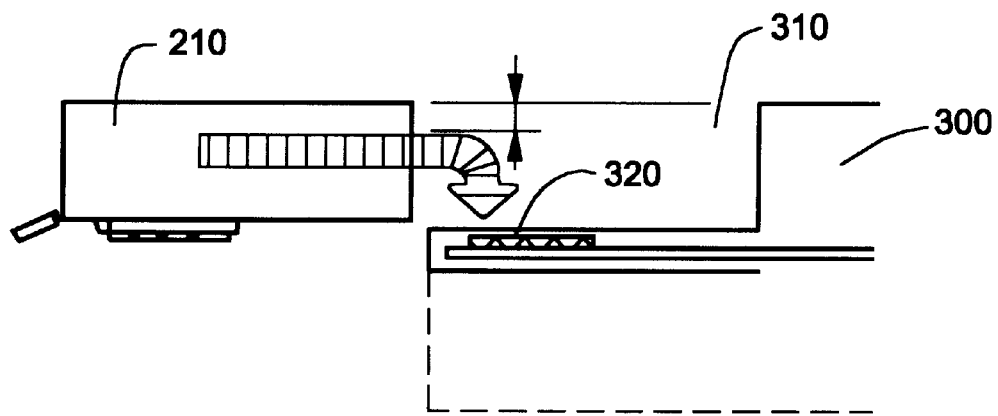
FIG. 5 illustrates a side view of the housing and enclosure of FIG. 3 in accordance with one embodiment of the present invention.

FIG. 5 illustrates a side view of housing 300 and enclosure 310 in accordance with one embodiment of the present invention. Casing 210 is inserted orthogonally into enclosure 310 and coupled to receptor 320. That is, in a case in which a computer system is horizontal, casing 210 is inserted into and removed from the computer system in a horizontal direction. In accordance with the present invention, only a small amount of clearance in the vertical direction is required to insert or remove casing 210. As will be seen, this characteristic is advantageous when multiple computer systems are mounted one on top of the other in a vertical rack or like device.

Figure 6:
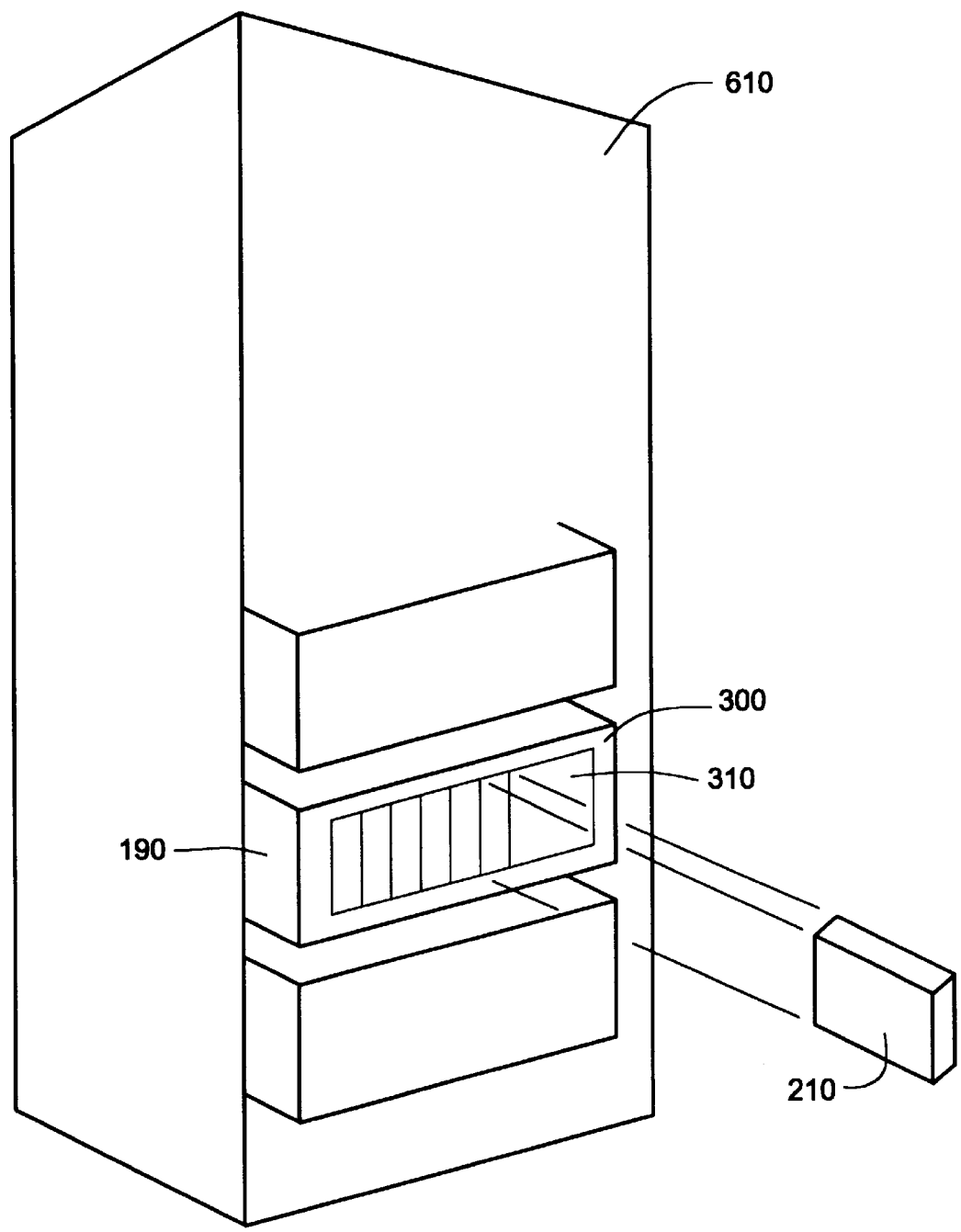
FIG. 6 shows a plurality of computer systems vertically mounted in rack in accordance with one embodiment of the present invention.

FIG. 6 shows a plurality of computer systems (e.g., computer system 190 of FIG. 1) vertically mounted in rack 610. Housing 300 of computer system 190 includes enclosure 310 in accordance with one embodiment of the present invention. In the present embodiment, casing 210 (containing circuit board 250 of FIG. 2A) is inserted and removed orthogonally into enclosure 310. By design, insertion and removal are accomplished with a low profile (see FIG. 5). Accordingly, it is not necessary to remove computer system 190 from rack 610 or open up its housing in order to install or remove a circuit board. Thus, it is also not necessary to uncable computer system 190 from other devices or to turn it off; that is, in accordance with the present invention, a circuit board can be installed or removed with the computer system powered on and cabled to other devices (e.g., a hot-swap).

In the present embodiment, each of a plurality of casings containing circuit boards are positioned side-by-side in enclosure 310. In combination with housing 300 and enclosure 310, casing 210 provides shielding to control and minimize EMI leakage. If a location is not occupied by a casing, then enclosure 310 provides the requisite EMI shielding. Alternately, a separate cap or cover (not shown) can be used to seal opening 320 to contain EMI when casing 210 is not present in a given location.

Figure 7:
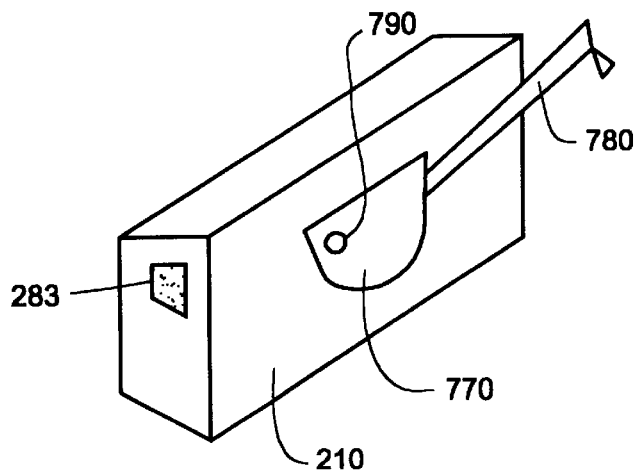
FIG. 7 illustrates one embodiment of a latching device in accordance with the present invention.

FIG. 7 illustrates one embodiment of latching device 260 in accordance with the present invention. Latching device 260 is used to secure casing 210 (containing circuit board 250 of FIG. 2A) to the computer system (specifically, to a slot 330 in enclosure 310; see FIG. 3). Latching device 260 also is used to couple internal connector interface 252 (FIG. 2B) to receptor 320 (FIG. 3). It is appreciated that other embodiments of latching device 260 can be used to secure casing 210 and to couple internal connector interface 252 with receptor 320.

With reference still to FIG. 7 and also with reference to FIGS. 2B and 3, latching device 260 includes cam 770, which pivots around pin 790, and lever 780. Movement of lever 780 causes cam 770 to rotate around pin 790 and engage slot 330. As cam 770 rotates into slot 330, casing 210 is caused to be pulled into its final seated position. This, in turn, engages internal connector interface 252 with receptor 320, and aligns opening 283 with damper 342 in housing 300, thus opening damper 342 and allowing cooling air to enter casing 210.

In one embodiment, a label can be affixed to latching device 260 (such as to the protruding end of lever 780) in order to identify the type or function of circuit board enclosed in casing 210.

In one embodiment, cam 770 can actuate switch 390 to signal insertion or extraction of casing 210, and thereby cause computer system 190 to electrically integrate circuit board 250 or to isolate the circuit board prior to its removal from the computer system.

Figure 8:
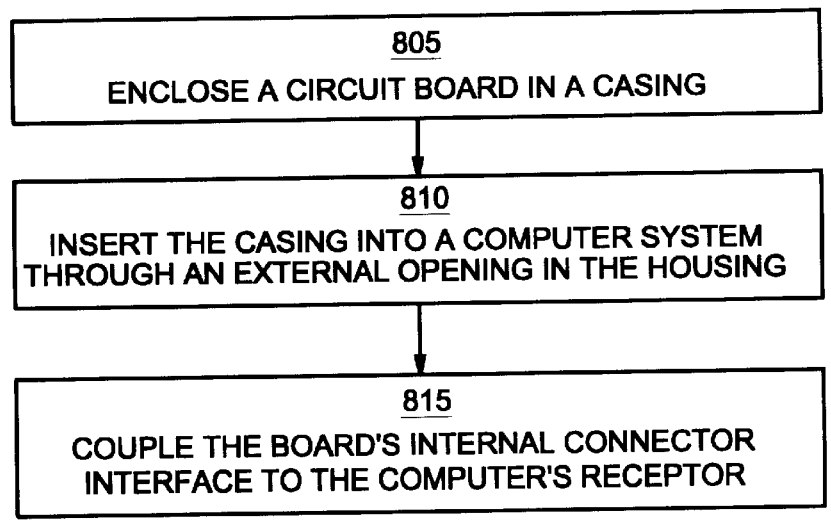
FIG. 8 is a flowchart of a process for installing a circuit board in accordance with one embodiment of the present invention.

FIG. 8 is a flowchart of process 800 for installing a circuit board (e.g., circuit board 250 of FIG. 2A) in accordance with one embodiment of the present invention. It is appreciated that the steps of process 800 can be essentially reversed to accomplish removing a circuit board in accordance with the present invention.

In step 805 of FIG. 8, with reference also to FIGS. 2A and 2B, circuit board 250 is enclosed in casing 210. In the present embodiment, casing 210 is comprised of first member 220a and second member 220b. In this embodiment, circuit board 250 is placed into one of these two members, and then first member 220 and second member 220b are coupled to form casing 210. In accordance with the present invention, internal connector interface 252 of circuit board 250 protrudes through internal opening 240 of casing 210.

In step 810 of FIG. 8, with reference also to FIGS. 3 and 4, casing 210 is inserted into a computer system (e.g., computer system 190 of FIG. 1) in an orthogonal direction through an external opening in housing 300 (that is, casing 210 is inserted into enclosure 310). In accordance with the present invention, it is not necessary to shut down the computer system or uncable it from peripheral devices. By inserting casing 210 into enclosure 310, damper 342 is caused to be opened, permitting air from cooling system 340 to be forced into casing 210 through opening 283 in order to cool circuit board 250.

In step 815 of FIG. 8, with reference also to FIGS. 3 and 4, internal connector interface 252 is aligned with and coupled to receptor 320. In the present embodiment, latching device 260 is actuated to seat and secure casing 210 in enclosure 310, and to seat and couple internal connector interface 252 with receptor 320 (refer also to FIG. 7). In one embodiment, latching device 260 triggers a switch that causes computer system 190 to electrically integrate circuit board 250 (and to isolate circuit board 250 prior to removing it from computer system 190).

In summary, the present invention pertains to a system and method thereof for installing and removing a circuit board in a computer system. The present invention allows the circuit board to be installed and removed orthogonally, from the direction of the circuit board's external connection. The present invention provides EMI shielding, circuit board cooling, the capability to install and remove the circuit board without having to shut down the computer or uncable it from other devices, and packaging that protects the circuit board during handling. The present invention allows the circuit board to be installed or removed without having to open the housing of the computer system or, in the case where the computer system is installed in a rack, remove the computer system from the rack. Thus, the present invention allows a computer system to be rapidly reconfigured.

Thus, the present invention provides a system and method thereof that facilitate modifying or upgrading the internal components of a computer system. The present invention also provides a system and method thereof that are suited for use in a close quarters environment, in particular one in which multiple computers are present and situated, for example, in a rack. The present invention also provides a system and method thereof that minimize the disruption to users and other computer systems, by allowing work to be performed while the computer system is powered on and cabled to other computer systems and minimizing, for example, electromagnetic radiation (EMI) leakage.

The preferred embodiment of the present invention, design for circuit board orthogonal installation and removal, is thus described. While the present invention has been described in particular embodiments, it should be appreciated that the present invention should not be construed as limited by such embodiments, but rather construed according to the following claims.

What is claimed is:

1. A system for inserting and removing a circuit board in a computer system, said system comprising:
    a casing sized and shaped to substantially enclose said circuit board, said circuit board having an internal connector interface for coupling said circuit board to said computer system;
    said casing having an opening for accessing said internal connector interface;
    said computer system adapted to allow insertion and removal of said casing containing said circuit board, wherein said computer system comprises a housing having an enclosure, said enclosure having an external opening of a size and shape sufficient to allow insertion of said casing, said computer system further comprising a switch that is actuated to electrically couple said circuit board to said computer system when said casing is inserted into said enclosure, said switch also for electrically decoupling said circuit board from said computer system when said casing is extracted;
    a receptor in said computer system for coupling with said internal connector interface; and
    wherein said casing containing said circuit board is inserted through said opening into said enclosure so that said internal connector interface couples with said receptor.

2. The system of claim 1 wherein said enclosure is of sufficient size and shape to contain a plurality of casings.

3. The system of claim 1 wherein said casing comprises a first member coupled to a second member, wherein said second member is separated from said first member to insert and remove said circuit board.

4. The system of claim 1 further comprising:
    a latching device coupled to said casing, said latching device for securing said casing to said computer system.

5. The system of claim 1 wherein said casing includes an identifier identifying said circuit board contained therein.

6. The system of claim 1 wherein said circuit board is an AGP (Accelerated Graphics Port) device.

7. The system of claim 1 wherein said circuit board is an EISA (Extended Industry Standard Architecture) device.

8. The system of claim 1 wherein said circuit board is a PCI (Peripheral Component Interconnect) device.

9. The system of claim 1 wherein said circuit board is an ISA (Industry Standard Architecture) device.

10. The system of claim 1 wherein said casing further comprises:
    an inlet port in said casing for cooling said circuit board;
    one or more exhaust ports in said casing for conveying heat away from said circuit board; and
    a cooling system in said computer system, wherein insertion of said casing into said computer system causes said inlet port to engage with said cooling system;
    wherein said casing facilitates circuit board cooling by directing air across said circuit board.

11. The system of claim 1 wherein said casing provides shielding for containing electromagnetic radiation.

12. The system of claim 1 wherein said casing further comprises one or more tabs projecting from an inner surface of said casing, said tabs for supporting said circuit board within said casing.

13. The system of claim 4 wherein said latching device further comprises:
    a cam rotationally coupled to said casing;
    a lever coupled to said cam such that movement of said lever causes said cam to rotate; and
    a slot in said computer system located so that said cam will enter said slot when rotated, said cam and said slot adapted to engage each other to fasten said casing to said enclosure.

14. A system for inserting and removing a circuit board in a computer system, said system comprising:
    a casing sized and shaped to substantially enclose said circuit board, said circuit board having an internal connector interface;
    said casing having an opening for accessing said internal connector interface;
    a housing of said computer system, said housing comprising an enclosure having an external opening of a size and shape sufficient to allow insertion of said casing; and
    a receptor in said enclosure for coupling with said internal connector interface;
    wherein said casing containing said circuit board is inserted through said external opening into said enclosure so that said internal connector interface couples with said receptor; and
    wherein said computer system comprises a switch that is actuated to electrically couple said circuit board to said computer system when said casing is inserted into said enclosure, said switch also for electrically decoupling said circuit board from said computer system when said casing is extracted.

15. A method for inserting and removing a circuit board in a computer system, said method comprising the steps of:
   a) enclosing said circuit board in a casing having an opening for accessing an internal connector interface of said circuit board;
   b) inserting said casing containing said circuit board into a housing of said computer system through an external opening in said housing; c) actuating a switch to electrically couple said circuit board to said computer system when said casing is inserted into said housing, wherein said switch electrically decouples said circuit board from said computer system when said casing is extracted: and d) coupling said internal connector interface with a receptor in said computer system.

16. The method of claim 15 wherein said step a) further comprises the steps of:
   a1) separating a first member from a second member of said casing;
   a2) inserting said circuit board into said first member; and
   a3) coupling said first member to said second member to enclose said circuit board.

17. The method of claim 15 wherein said steps b) c), and d) are performed with said computer system powered on.

18. The method of claim 15 wherein said casing further comprises an inlet port for cooling said circuit board and one or more exhaust ports for conveying heat away from said circuit board, wherein said inlet port is engaged with a cooling system of said computer system.

19. The method of claim 15 wherein said step d) further comprises the steps of:
   d1) aligning said internal connector interface with said receptor; and
   d2) actuating a latching device that causes said internal connector interface to couple with said receptor.

20. The method of claim 15 wherein said casing further comprises one or more tabs projecting from an inner surface of said casing, said tabs for supporting said circuit board within said casing.

21. The method of claim 15 wherein said circuit board is an AGP (Accelerated Graphics Port) device.

22. The method of claim 15 wherein said circuit board is an EISA (Extended Industry Standard Architecture) device.

23. The method of claim 15 wherein said circuit board is a PCI (Peripheral Component Interconnect) device.

24. The method of claim 15 wherein said circuit board is an ISA (Industry Standard Architecture) device.

25. The method of claim 15 wherein said casing provides shielding for containing electromagnetic radiation.

26. The method of claim 19 wherein said latching device engages said computer system to secure said casing to said computer system.

27. A system for inserting and removing a circuit board in a computer system, said system comprising:
   a casing sized and shaped to substantially enclose said circuit board, said circuit board having an internal connector interface for coupling said circuit board to said computer system;
   said casing having an opening for accessing said internal connector interface;
   said computer system adapted to allow insertion and removal of said casing containing said circuit board;
   a receptor in said computer system for coupling with said internal connector interface, wherein said casing containing said circuit board is inserted into said computer system so that said internal connector interface couples with said receptor; and
   a latching device coupled to said casing, said latching device for securing said casing to said computer system, said latching device comprising:
   a cam rotationally coupled to said casing;
   a lever coupled to said cam such that movement of said lever causes said cam to rotate; and
   a slot in said computer system located so that said cam will enter said slot when rotated, said cam and said slot adapted to engage each other to fasten said casing to said enclosure.

28. A system for inserting and removing a circuit board in a computer system, said system comprising:
   a casing sized and shaped to substantially enclose said circuit board, said circuit board having an internal connector interface for coupling said circuit board to said computer system;
   said casing having an opening for accessing said internal connector interface, said casing further comprising:
   an inlet port in said casing for cooling said circuit board; and
   one or more exhaust ports in said casing for conveying heat away from said circuit board;
   a cooling system in said computer system, wherein insertion of said casing into said computer system causes said inlet port to engage with said cooling system and wherein said casing facilitates circuit board cooling by directing air across said circuit board;
   said computer system adapted to allow insertion and removal of said casing containing said circuit board; and
   a receptor in said computer system for coupling with said internal connector interface;
   wherein said casing containing said circuit board is inserted into said computer system so that said internal connector interface couples with said receptor.

29. The system of claim 28 wherein said enclosure is of sufficient size and shape to contain a plurality of casings.

30. The system of claim 28 wherein said computer system further comprises a switch that is actuated to electrically couple said circuit board to said computer system when said casing is inserted into said enclosure, said switch also for electrically decoupling said circuit board from said computer system when said casing is extracted.

31. The system of claim 28 wherein said casing comprises a first member coupled to a second member, wherein said second member is separated from said first member to insert and remove said circuit board.

32. The system of claim 28 further comprising:
   a latching device coupled to said casing, said latching device for securing said casing to said computer system.

33. The system of claim 32 wherein said latching device further comprises:
   a cam rotationally coupled to said casing;
   a lever coupled to said cam such that movement of said lever causes said cam to rotate; and
   a slot in said computer system located so that said cam will enter said slot when rotated, said cam and said slot adapted to engage each other to fasten said casing to said enclosure.

34. The system of claim 28 wherein said casing includes an identifier identifying said circuit board contained therein.

35. The system of claim 28 wherein said casing provides shielding for containing electromagnetic radiation.

36. The system of claim 28 wherein said casing further comprises one or more tabs projecting from an inner surface of said casing, said tabs for supporting said circuit board within said casing.

37. A method for inserting and removing a circuit board in a computer system, said method comprising the steps of:
   a) enclosing said circuit board in a casing having an opening for accessing an internal connector interface of said circuit board, wherein said casing further comprises an inlet port for cooling said circuit board and one or more exhaust ports for conveying heat away from said circuit board, wherein said inlet port is engaged with a cooling system of said computer system;
   b) inserting said casing containing said circuit board into a housing of said computer system through an external opening in said housing; and
   c) coupling said internal connector interface with a receptor in said computer system.

* * * * *